US012690131B2

(12) United States Patent
Yang

(10) Patent No.: US 12,690,131 B2
(45) Date of Patent: Jul. 21, 2026

(54) FLAT FLEXIBLE PRINTED CIRCUIT

(71) Applicant: Samkee EV CO., LTD., Seosan-si (KR)

(72) Inventor: Seung Duk Yang, Hwaseong-si (KR)

(73) Assignee: Samkee Ev Co., Ltd., Seosan-si (KR)

( * ) Notice: Subject to any disclaimer, the term of this patent is extended or adjusted under 35 U.S.C. 154(b) by 167 days.

(21) Appl. No.: 18/684,051

(22) PCT Filed: Jul. 15, 2022

(86) PCT No.: PCT/KR2022/010339
§ 371 (c)(1),
(2) Date: Feb. 15, 2024

(87) PCT Pub. No.: WO2023/022375
PCT Pub. Date: Feb. 23, 2023

(65) Prior Publication Data
US 2024/0306301 A1 Sep. 12, 2024

(30) Foreign Application Priority Data

Aug. 17, 2021 (KR) ........................ 10-2021-0108206
Aug. 17, 2021 (KR) ........................ 10-2021-0108207
(Continued)

(51) Int. Cl.
*H05K 1/11* (2006.01)
*H01R 12/77* (2011.01)
*H05K 1/02* (2006.01)

(52) U.S. Cl.
CPC ........... *H05K 1/118* (2013.01); *H01R 12/771* (2013.01); *H05K 1/028* (2013.01); *H05K 2201/2009* (2013.01)

(58) Field of Classification Search
CPC ........ H05K 1/118; H05K 1/189; H05K 1/028; H05K 1/115; H05K 1/147;
(Continued)

(56) References Cited

U.S. PATENT DOCUMENTS 3,239,916 A 3/1966 Lee
4,829,404 A 5/1989 Jensen
(Continued)

FOREIGN PATENT DOCUMENTS

BE 896280 A 9/1983
EP 0696034 A1 2/1996
(Continued)

OTHER PUBLICATIONS

Yoo Jae Cheon, "Office Action for KR Application No. 10-2022-0084984", Feb. 19, 2024, KIPO, Republic of Korea.
(Continued)

*Primary Examiner* — Roshn K Varghese
(74) *Attorney, Agent, or Firm* — Bridgeway IP Law Group, PLLC; Jihun Kim

(57) ABSTRACT

Embodiment relates to a flat flexible printed circuit and, more specifically, to a flat flexible printed circuit which is flexible, due to the inclusion of films, and on which a surface mount technology (SMT) terminal can be mounted. According to the embodiment, the flat flexible printed circuit includes a film material capable of withstanding high temperatures, and thus can be electrically connected to an external device in a high-temperature environment and, as a result, is highly versatile.

16 Claims, 9 Drawing Sheets

(30)        Foreign Application Priority Data

Aug. 17, 2021    (KR) ........................ 10-2021-0108208
Aug. 17, 2021    (KR) ........................ 10-2021-0108209

(58)  Field of Classification Search
CPC ... H05K 2201/2009; H05K 2201/0154; H05K
          2201/052; H05K 2201/053; H05K
          2201/0919; H05K 2201/09445; H05K
          2201/055; H05K 2201/10189
    USPC ......................................... 174/117 F, 117 FF
    See application file for complete search history.

(56)               References Cited

U.S. PATENT DOCUMENTS

| | | | | |
|---|---|---|---|---|
| 8,779,292 B2* | 7/2014 | Wang | ................... | B23K 1/0016 |
| | | | | 174/117 FF |
| 2002/0081894 A1* | 6/2002 | Fuerst | .................. | H01R 12/613 |
| | | | | 439/492 |
| 2004/0055784 A1* | 3/2004 | Joshi | .................... | B23K 1/0008 |
| | | | | 174/254 |
| 2007/0256855 A1* | 11/2007 | Tarte | ...................... | H05K 1/118 |
| | | | | 174/117 F |
| 2009/0122509 A1* | 5/2009 | Castillo Garcia | ...... | H05K 1/118 |
| | | | | 361/827 |
| 2015/0014018 A1* | 1/2015 | Ji | ........................... | H05K 1/028 |
| | | | | 174/117 F |
| 2015/0211718 A1* | 7/2015 | Diekmann | .............. | F21V 17/12 |
| | | | | 174/254 |
| 2015/0237716 A1* | 8/2015 | Su | .......................... | H05K 1/118 |
| | | | | 174/254 |
| 2017/0006710 A1 | 1/2017 | Diana et al. | | |

FOREIGN PATENT DOCUMENTS

| | | | |
|---|---|---|---|
| GB | 2121594 | A | 12/1983 |
| JP | 07-038220 | A | 2/1995 |
| JP | H0738220 | A | 2/1995 |
| JP | 2001-332853 | A | 11/2001 |
| JP | 2008-146944 | A | 6/2008 |
| JP | 2009-182294 | A | 8/2009 |
| JP | 5920522 | B2 | 5/2016 |
| JP | 2019-036424 | A | 3/2019 |
| KR | 10-0166146 | B1 | 2/1999 |
| KR | 10-1135108 | B1 | 4/2012 |
| WO | 2021/156485 | A1 | 8/2021 |

OTHER PUBLICATIONS

Examiner, "Office Action for KR Application No. 10-2022-0084982", Aug. 13, 2024, KIPO, KR.
Examiner, "Office Action for KR Application No. 10-2022-0084983", Aug. 13, 2024, KUOI, KR.

\* cited by examiner

510

610

620

FLAT FLEXIBLE PRINTED CIRCUIT

TECHNICAL FIELD

The present disclosure relates to a flat flexible printed circuit, and more particularly, to a flat flexible printed circuit, which is flexible by including a film and is capable of accommodating a surface mount technology (SMT) terminal.

BACKGROUND ART

The rapid advancement of digital information industries due to the advancement in scientific technology has made computers an indispensable commodity. In the field of technology related to computer equipment, the efficiency of signal transmission via wiring in transmission of control signals and data signals is closely related to the overall operational efficiency of computers.

Conventional flexible printed circuit boards (FPCBs) which are produced in a sheet type, have a limitation in size manufactured in the length direction and have several disadvantages due to complex manufacturing processes and high manufacturing costs.

The background art of the present invention is disclosed in Korean Patent No. 10-1135108.

DISCLOSURE

Technical Problem

Accordingly, the present invention has been made in view of the above-mentioned problems occurring in the related art, and it is an object of the present invention to provide a flat flexible printed circuit capable of electrically connecting to external devices in high-temperature environments by being made of a film material resistant to high temperatures, thereby transmitting electrical signals reliably.

It is another object of the present invention to provide a flat flexible printed circuit, which is manufactured through a roll-to-roll lamination process, has no limitation in length of products, reduces the number of processes for other wires, and lowers manufacturing costs.

It is a further object of the present invention to provide a flat flexible printed circuit, which is small in volume and is lightweight by wrapping both sides of a plurality of conductors with a flexible film compared to other wires.

It is a still further object of the present invention to provide a flat flexible printed circuit, which can be mounted on an external device by perforating the plurality of conductors and the film on the both sides, and can be branched and bent by being cut according to predetermined patterns.

It is another object of the present invention to provide a flat flexible printed circuit, which can be electrically connected to a plurality of external devices by branching multiple connection parts electrically connected to both ends.

The objects of the present invention are not limited to those mentioned above, and other objects not mentioned herein will be clearly understood by those skilled in the art from the following description.

Technical Solution

To accomplish the above-mentioned objects, according to the present invention, there is provided a flat flexible printed circuit.

The flat flexible printed circuit according to an embodiment of the present invention includes: a cable part, which includes a first film, a plurality of conductors provided on one surface of the first film, and a second film which faces the first film in a state in which the plurality of conductors are interposed between the first film and the second film, and is adhered to the first film; a first connector part, which is positioned at an end of the cable part to electrically connect the conductors included in the cable part to the external; and a terminal connection part, which exposes some conductors to the outside of the first film in a state in which some area of the first film corresponding to the some conductors among the plurality of conductors are perforated.

Advantageous Effect

According to an embodiment of the present invention, the flat flexible printed circuit can be electrically connected to external devices in high-temperature environments by being made of a film material resistant to high temperatures, thereby exhibiting high versatility.

According to an embodiment of the present invention, the flat flexible printed circuit is manufactured through a roll-to-roll lamination process, so has no limitation in length of products, reduces the number of processes for other wires, and lowers manufacturing costs, thereby resulting in high economic and business viability.

According to an embodiment of the present invention, the flat flexible printed circuit is small in volume and is lightweight by wrapping both sides of a plurality of conductors with the flexible film compared to other wires, thereby enhancing usability.

According to an embodiment of the present invention, the flat flexible printed circuit can be mounted on an external device by perforating the plurality of conductors and the film on the both sides, and can be branched and bent by being cut according to predetermined patterns, thereby achieving high flexibility and versatility.

According to an embodiment of the present invention, the flat flexible printed circuit can be electrically connected to a plurality of external devices by branching multiple connection parts electrically connected to both ends, thereby enhancing ease of use.

The effects of the present invention are not limited to the above-mentioned effects, and other effects, which are not specifically mentioned herein, will be clearly understood by those skilled in the art from the following description.

BEST MODE

Figure 1:
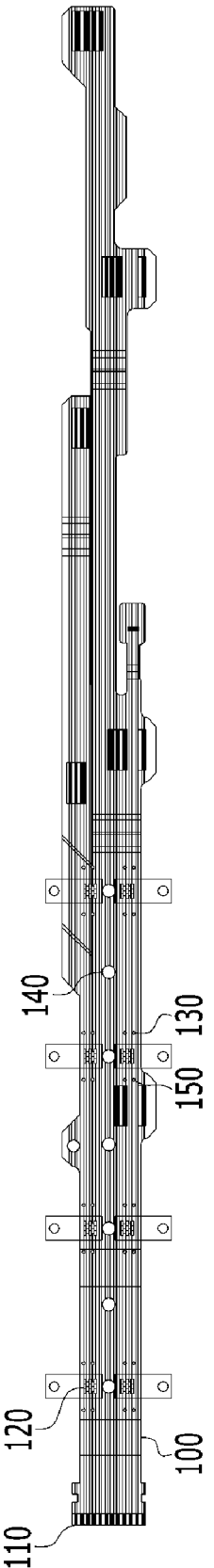
FIGS. 1 to 3 illustrate a flat flexible printed circuit according to an embodiment of the present invention.

Hereinafter, the present invention will be described in detail with reference to the accompanying drawings. However, embodiments of the present invention may be implemented in several different forms and are not limited to the embodiments described herein. In addition, parts irrelevant to description are omitted in the drawings in order to clearly explain embodiments of the present invention. Similar parts are denoted by similar reference numerals throughout this specification.

Throughout this specification, when a part is referred to as being "connected" to another part, this includes "direct connection" and "indirect connection" via an intervening part. Also, when a certain part "includes" a component, other components are not excluded unless explicitly described otherwise, and other components may in fact be included.

The terms used in the following description are intended to merely describe specific embodiments, but not intended to limit the invention. An expression of the singular number includes an expression of the plural number, so long as it is clearly read differently. The terms such as "include" and "have" are intended to indicate that features, numbers, steps, operations, elements, components, or combinations thereof used in the following description exist and it should thus be understood that the possibility of existence or addition of one or more other different features, numbers, steps, operations, elements, components, or combinations thereof is not excluded.

Hereinafter, embodiments of the present invention will be described in detail with reference to the accompanying drawings.

Figure 2:
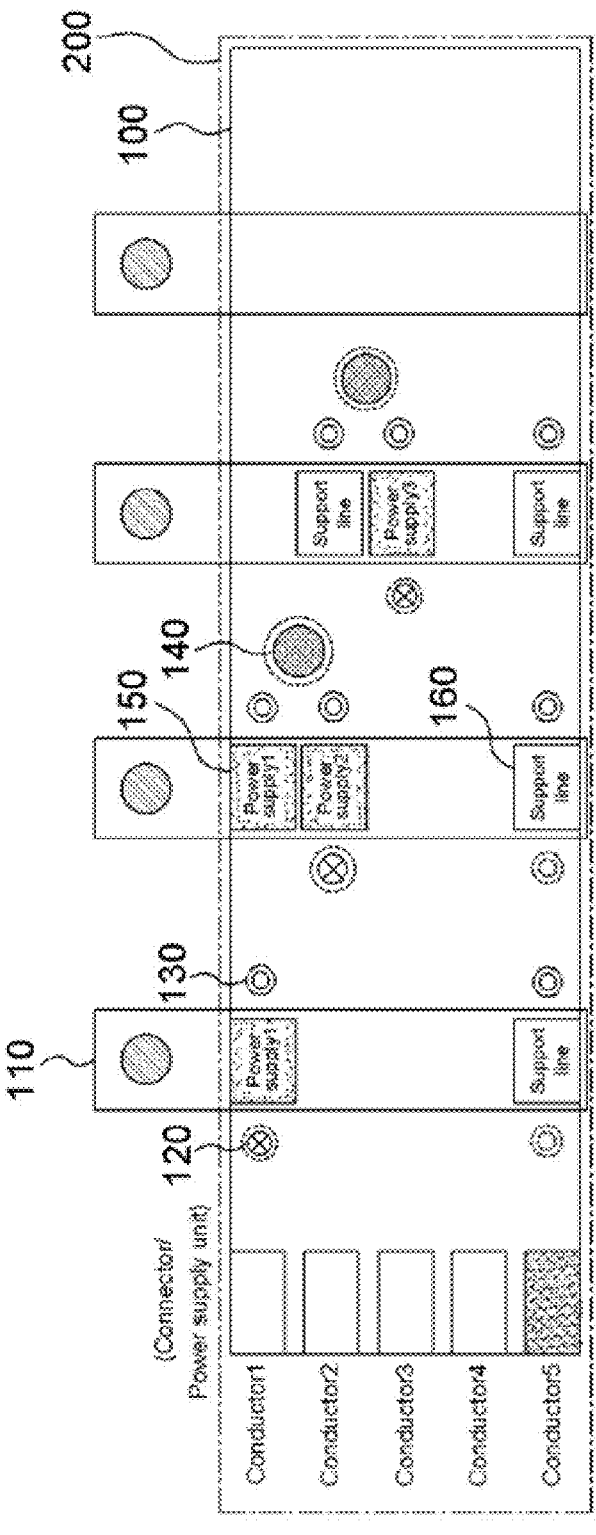
Figure 3:
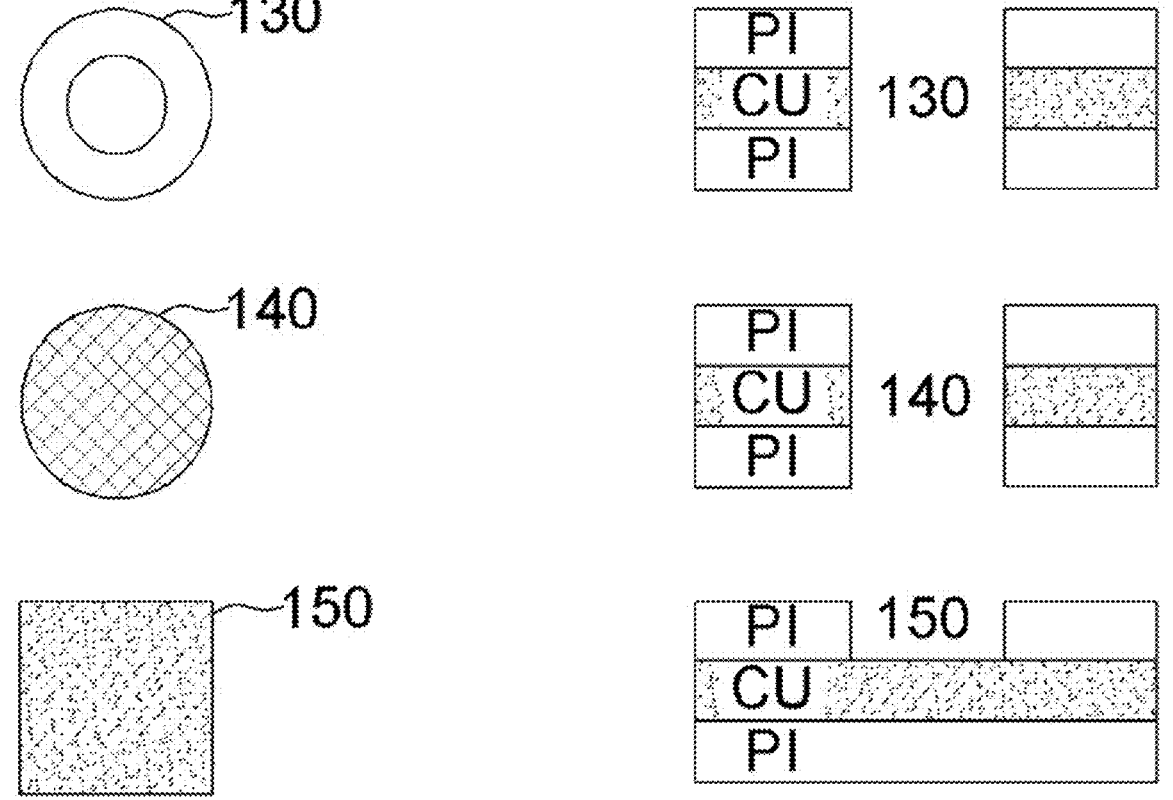

FIGS. 1 to 3 illustrate a flat flexible printed circuit according to an embodiment of the present invention.

Referring to FIG. 1, the flat flexible printed circuit may include a cable part 100, a first connector part 110, a terminal connection part 120, a penetration part 130, a support part 140, and an inspection part 150.

The cable part 100 includes a first film, a plurality of conductors arranged on one surface of the first film, and a second film which faces the first film in a state in which the plurality of conductors are interposed between the first film and the second film, and is adhered to the first film.

Here, the first or the second film may be, for example, a polyimide film which is resistant to high temperatures.

Additionally, the conductors may be made of materials capable of conducting electricity, such as copper conductors.

The cable part 100 can be manufactured through a roll-to-roll lamination process, where the plurality of conductors are sandwiched between the first and second films and the first film and the second film are adhered to each other. Due to the production via roll-to-roll lamination, the cable part 100 can be produced as many as the length rolled on a roll in the length direction. Therefore, the cable part has no limitation in length of products, reduces the number of processes for other wires, and lowers manufacturing costs, thereby enhancing economic and business possibility.

The first connector part 110 is positioned at one end of the cable part 100 to electrically connect the conductors included in the cable part 100 to the outside. The first connector part 110 can be branched together with a portion of the conductors included in the cable part 100.

Some area of the first film corresponding to some of the plurality of conductors of the cable part 100 are perforated to expose some conductors to the outside of the first film, so SMT terminals are connected to the terminal connection part 120. The terminal connection part 120 may further include support lines which physically support the connection with SMT terminals by using the conductors not electrically connected to the SMT terminals. For instance, when the first to fourth copper conductors are not disconnected to the cable part 100 but the fifth copper conductor is disconnected, the fifth copper conductor can be used as a support line.

Additionally, multiple terminal connection parts 120 may be arranged in the cable part 100, and may be joined with the SMT terminals through connection tools, adhesives, or soldering. Referring to FIG. 1, for example, the plurality of SMT terminals may be arranged parallel in the width direction centered around the support part 140. Referring to FIG. 2, for example, a first SMT terminal to a fourth SMT terminal may be arranged parallel in the length direction within the cable part 100. Referring to FIG. 2, for example, the first SMT terminal may be electrically connected to a first conductor, and the second SMT terminal may be electrically connected to a second conductor. Here, the first conductor may be disconnected after the first SMT terminal by the penetration part 130, and may be inspected for the conductivity by the inspection part 150. In addition, the first conductor may be disconnected from the first connector part 110, and may be used as a support line at the second SMT terminal portion. Additionally, the second conductor may be disconnected after the second SMT terminal by the penetration part 130, and may be inspected for the conductivity by the inspection part 150. Furthermore, the second conductor may be disconnected from the first connector part 110, and may be used as a support line at the third SMT terminal portion.

The penetration part 130 is located at a predetermined distance in the opposite direction to the first connector part 110 based on the terminal connection part 120. At least one conductor among the exposed conductors, and the first film area and the second film area corresponding to the at least one conductor are perforated to disconnect the at least one conductor.

The penetration part 130 may have the form where the first film, the conductors, and the second film of an area penetrate, as illustrate in FIG. 3.

The penetration part 130 disconnects the conductors after the position where the conductors are electrically connected to the terminal connection part 120, thereby preventing confusion in electrical connection between the connector part 110 and the terminal connection part 120.

The support part 140 is formed by perforating a portion of the cable part 100 so that the cable part 100 can be supported on an external device. The support part 140 may penetrate some areas of the first film of the cable part 100, the conductors corresponding to the areas of the first film, and some areas of the second film corresponding to the areas of the first film, so as to be supported on another external device. The support part 140 may be formed in a shape corresponding to support holes of different external devices, for example, may be formed by punching at positions of retaining holes matching the specifications of a battery model. Additionally, the support part 140 may be formed at a portion corresponding to a predetermined distance from the terminal connection part 120. For example, the support part 140 can be generated by punching at positions matching the specifications of retaining holes of the battery model to fit the setting of the cable part 100.

The inspection part 150 is positioned at a predetermined distance from the terminal connection part 120 in the direction of the first connector part 110 and can inspect the electrical flow of at least one conductor by perforating some areas of the first film corresponding to at least one conductor among the exposed conductors. A portion of the inspection part 150, which can inspect the electrical connection between the connector part 110 and the terminal connection part 120, may have a hole shape.

When the SMT terminals are connected to the cable part 100, the inspection part 150 can be formed in the direction of the first connector part 110 from the terminal connection part 120. Here, the inspection part 150 may be arranged in the same number as the conductors connected to the SMT terminals.

Figure 4:
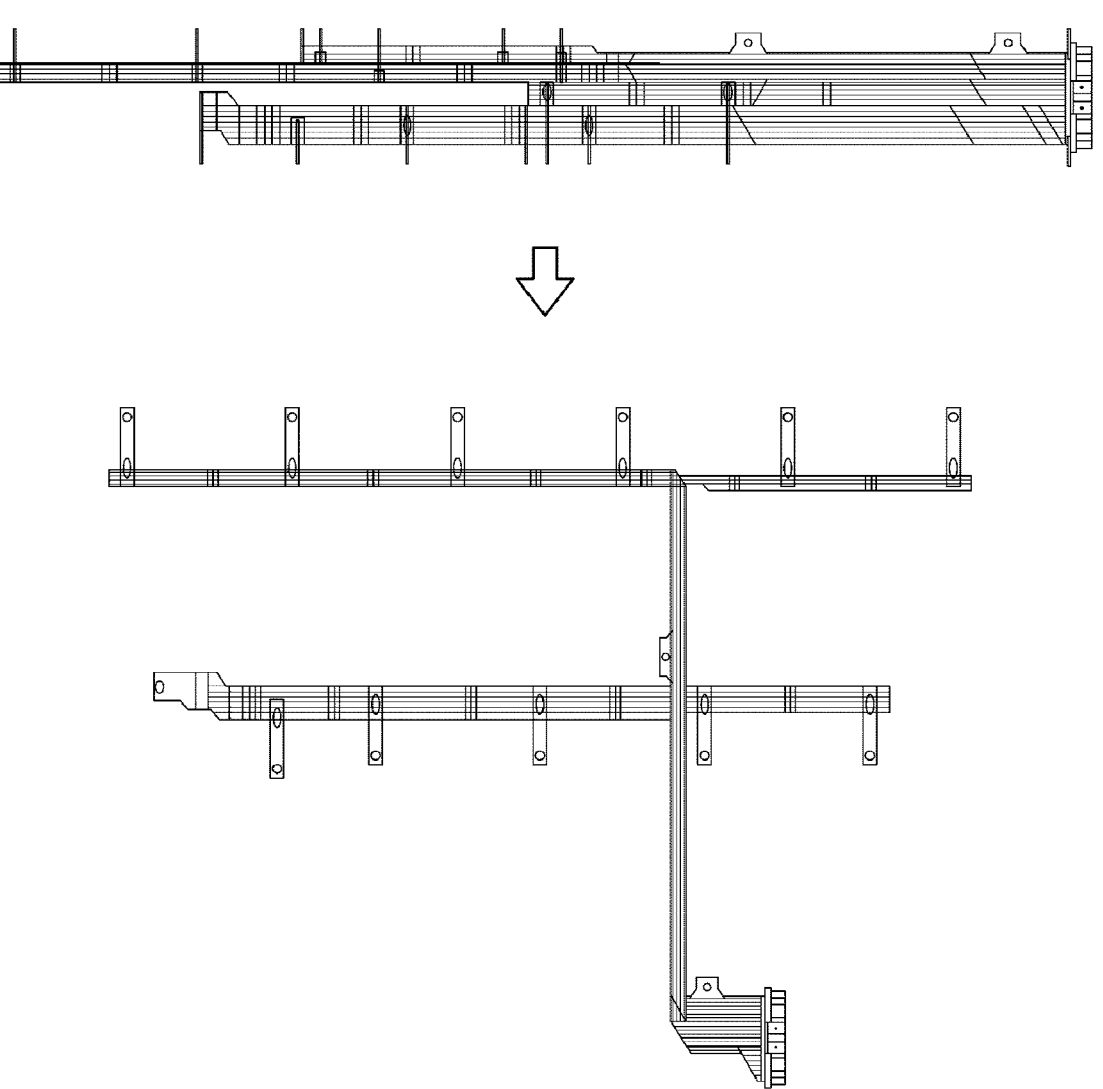
FIGS. 4 to 6 illustrate flat flexible printed circuits including branching structures according to an embodiment of the present invention.
Figure 5:
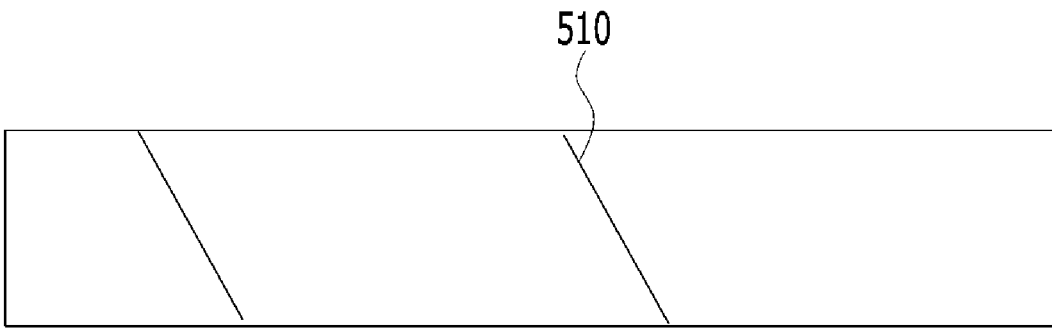
Figure 6:
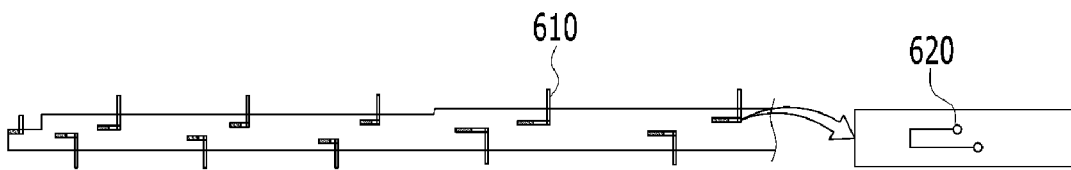

FIGS. 4 to 6 illustrate flat flexible printed circuits having branching structures according to an embodiment of the present invention.

Referring to FIG. 4, the flat flexible printed circuit according to the present invention may include a plurality of branch cable parts in which the cable part 100 is branched in the length direction, and accommodates some conductors among the plurality of conductors.

The flat flexible printed circuit may include, for example, a first branch cable part including some conductors among the plurality of conductors branched in the length direction and a second branch cable part including other some conductors among the plurality of conductors.

Moreover, the flat flexible printed circuit may include bent portions which are bent at a predetermined angle in the width direction of the cable part 100 and are electrically connected to external devices.

The flat flexible printed circuit can realize branching and bending processes through printing patterns.

For the branching of the cable part 100, the flat flexible printed circuit may have branch lines formed on the film. Here, the branch lines may be spaced at predetermined intervals in the length direction of the cable part 100 and to be printed. The branch lines may have various forms according to the branching form in the length direction of the cable part 100.

Referring to FIG. 5, the bent portion may have diagonally bent lines 510 indicated to bend some portions of the cable part 100 in the width direction of the cable part 100. The bent lines 510 may be formed in a linear form with an angle of 45 degrees From the horizontal direction on the first film or the second film at the bent portions of the first branch cable part or the second branch cable part.

Furthermore, referring to FIG. 6, the cable part 100 of the flat flexible printed circuit may include folding portions 610 in which some conductors among the plurality of conductors are cut and folded.

Here, the folding portion 610, for example, can be cut and folded in a '⊏' shape pattern. The folding portion 610 may further include a support hole portion 620 to prevent tearing at the cut point.

Figure 7:
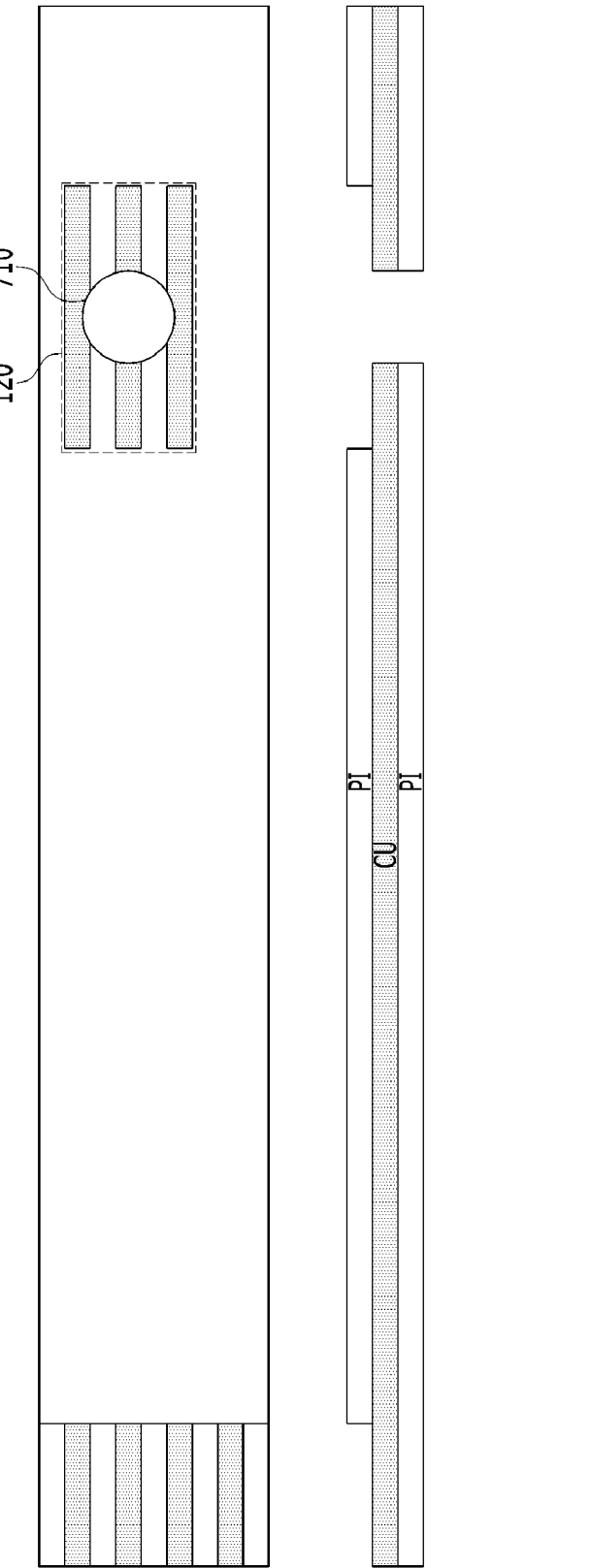
FIGS. 7 to 9 illustrate flat flexible printed circuits interfacing with an external device according to one embodiment of the present invention.
Figure 8:
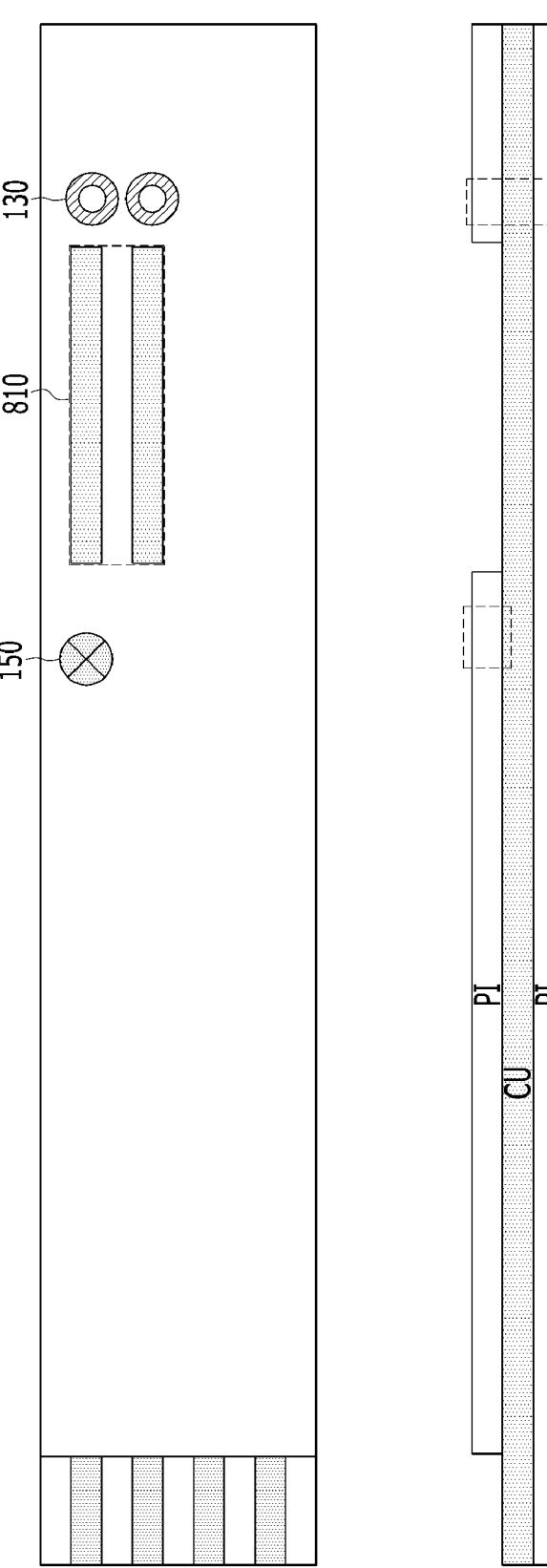
Figure 9:
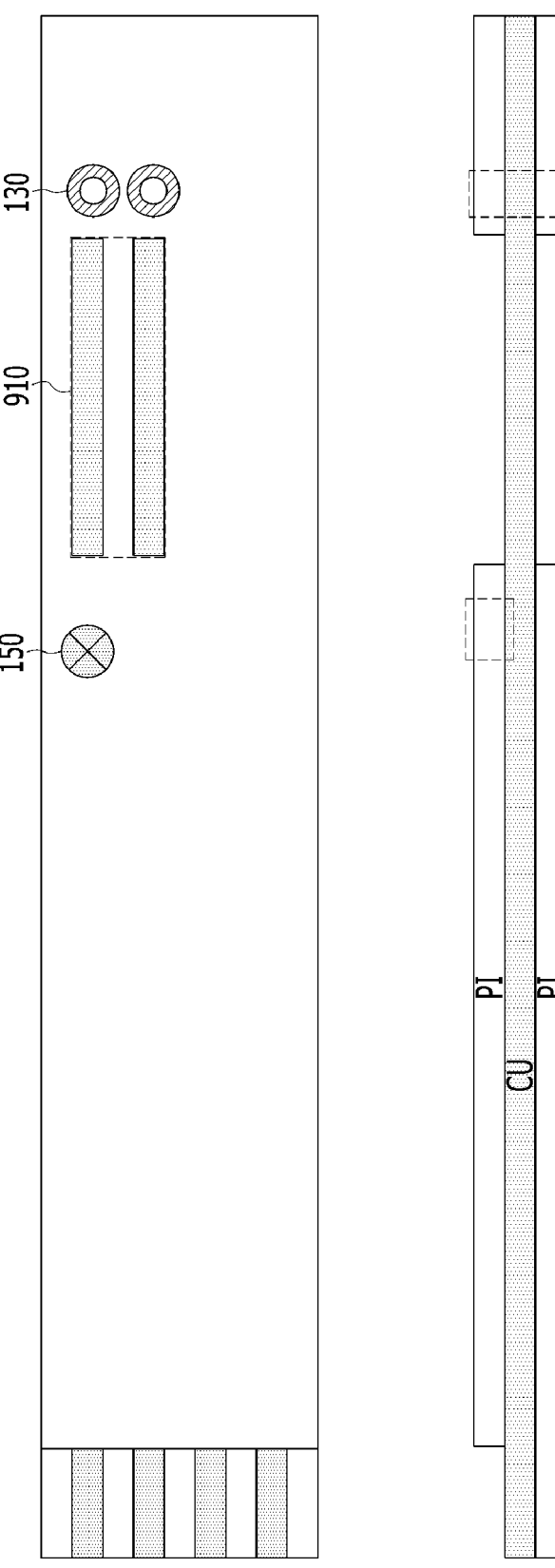

FIGS. 7 to 9 illustrate flat flexible printed circuits interfacing with an external device according to one embodiment of the present invention.

Referring to FIG. 7, the terminal connection part 120 of the flat flexible printed circuit may further include a coupling tool fastening portion 710 which electrically connects some exposed conductors to the outside using a coupling tool by perforating some conductors exposed to some areas of the first film and the second film corresponding to the conductors. Here, the coupling tool may be a tool made of a material with electrical conduction, such as a rivet or a bolt. The flat flexible printed circuit can form a structure connected to a busbar via the rivet or the bolt.

Referring to FIG. 8, the terminal connection part 120 of the flat flexible printed circuit may further include a bonding portion 810 which electrically connects some exposed conductors to the outside by applying bonding agents to the some conductors exposed to some area of the first film. Here, the bonding agents may be, for example, tin, anisotropic conductive film (ACF), or anisotropic conductive paste (ACP). The flat flexible printed circuit can bond the bonding portion 810 with another external device by applying heat above a predetermined temperature to the bonding portion 810. Here, the predetermined temperature may be 200 degrees Celsius.

Referring to FIG. 9, the terminal connection part 120 of the flat flexible printed circuit may further include a fusion coupling portion 910 which electrically fuses and bonds some conductors exposed to some areas of the first and second films to the outside when some conductors exposed to some areas of the first film and some areas of the second film corresponding to the conductors are exposed. Here, the fusion coupling portion 910 can bond the corresponding conductors to other external devices by fusing the conductors, for example, via ultrasonic or laser fusion.

Figure 10:
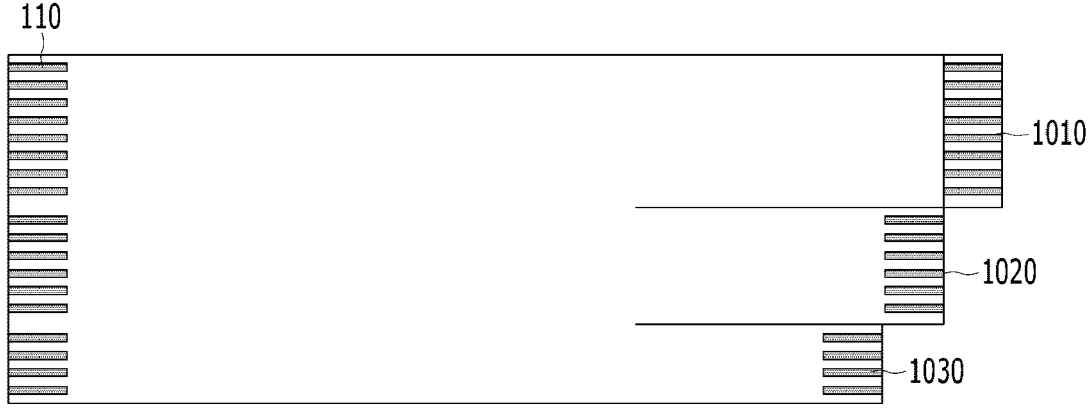
FIGS. 10 and 11 illustrate flat flexible printed circuits connected to a plurality of external devices according to an embodiment of the present invention.
Figure 11:
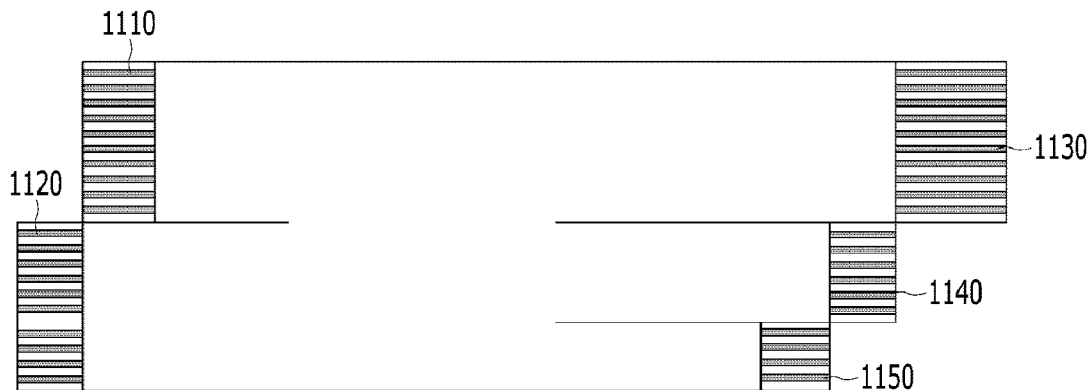

FIGS. 10 and 11 illustrate flat flexible printed circuits connected to a plurality of external devices according to an embodiment of the present invention.

The flat flexible printed circuit may further include a second connector part which is positioned at the other end of the cable part 100 to electrically connect the conductors included in the cable part 100 to the outside.

Referring to FIG. 10, the first connector part 110 may include a connector with 18 pins to which 18 conductors are connected. The second connector part may be branched into three.

The second connector part may include: a first partial end connector part 1010 which connects some conductors of multiple conductors included in the cable part 100 to the outside; a second partial end connector part 1020 which is cut in the length direction of the cable part 100 and separated differently from the first partial end connector part 1010 to connect other some conductors to the outside; and a third terminal partial connector part 1030 which is cut in the length direction of the cable part 100 to be separated differently from the second partial end connector part 1020 to connect other some conductors to the outside.

Referring to FIG. 10, the second connector part may include the first partial end connector part 1010 with eight pins to which eight conductors are connected, the second partial end connector part 1020 with six pins to which six conductors are connected, and the third partial end connector part 1030 with four pins to which four conductors are connected.

Here, the first partial end connector part 1010, the partial end connector part 1020, and the third partial end connector part 1030 may include branched cable parts of different lengths.

Referring to FIG. 11, the first connector part 110 may branch into two, and includes: a first partial connector part 1110 that electrically connects some conductors of the plurality of conductors included in the cable part 100 to the outside; and a second partial connector part 1120 that is cut in the length direction of the cable part 100 and separated differently from the first partial connector part 1110 to connect other some conductors to the outside. Here, the first connector part 110 may include the first partial connector part 1110 with ten pins to which ten conductors are connected, and the second partial connector part 1120 with ten pins to which other ten conductors are connected. Additionally, the first partial connector part 1110 and the second partial connector part 1120 may include branched cable parts of different lengths.

Moreover, the second connector part may include a first partial end connector part 1110 with ten pins to which ten conductors are connected, a second partial end connector part 1120 with six pins to which six conductors are connected, and a third partial end connector part 1130 with four pins to which four conductors are connected.

In addition, the first partial end connector part 1110, the partial end connector part 1120, and the third partial end connector part 1130 may include branched cable parts of different lengths.

The description of the present invention provided herein is exemplary. Those skilled in the art will understand that the present invention can be implemented as other concrete forms without changing the inventive concept or essential features. Therefore, these embodiments as described above are only proposed for illustrative purposes and do not limit the present invention. It will be apparent to those skilled in the art that a variety of modifications and variations may be made without departing the spirit and scope of the present invention as defined by the appended claims. Further, such modifications and variations should not be understood independently from the technical idea or perspective of the present invention.

The scope of the invention is indicated by the appended claims, and all modifications or variations derived from the meaning and scope of the claims and the concept of equivalents thereof are to be interpreted as being within the scope of the invention.

Mode for Invention

The mode for the present invention has been described together with the best mode for practicing the present invention.

INDUSTRIAL APPLICABILITY

The present invention, which includes a film material resistant to high temperatures, enables electrical connection with external devices in high-temperature environments to provide high versatility, thereby having industrial applicability.

The invention claimed is:

1. A flat flexible printed circuit comprising: a cable part including a first film, a plurality of conductors disposed on the first film, and a second film attached to the first film so as to face the plurality of conductors; a first connector part disposed at an end of the cable part and electrically connected to the plurality of conductors to an external device; a terminal connection part formed by perforating a portion of the first film to expose at least one of the plurality of conductors such that a surface-mount terminal can be connected to the at least one of the plurality of conductors, wherein the terminal connection part includes a support line which physically supports a connection of the surface-mount terminal using the at least of the plurality of conductors not electrically connected to the surface-mount terminal; an inspection part located in a direction toward the first connector part from the terminal connection part, the inspection part being formed by perforating a portion of the first film corresponding to the at least one of the plurality of conductors so as to allow electrical inspection of the at least one of the plurality of conductors, wherein the inspection part is arranged in a number equal to a number of conductors connected to the surface-mount terminal; a penetration part located at a predetermined distance from the terminal connection part in a direction opposite to the first connector part, the penetration part perforating the at least one of the plurality of conductors and corresponding areas of the first film and the second film to disconnect the at least one of the plurality of conductors after a position where the at least one of the plurality of conductors is electrically connected to the terminal connection part; and a support part which penetrates a portion of the cable part excluding the terminal connection part to support the cable part on the external device.

2. The flat flexible printed circuit according to claim 1, wherein the cable part includes:
   a first branch cable part branching in a lengthwise direction and including a first number of conductors among the plurality of conductors, and
   a second branch cable part including a second number of conductors different from the first number of conductors among the plurality of conductors.

3. The flat flexible printed circuit according to claim 2, wherein the first branch cable part or the second branch cable part includes a bent portion bent at a predetermined angle in a widthwise direction of the cable part to be electrically connected to an external device.

4. The flat flexible printed circuit according to claim 3, wherein the bent portion is indicated by a bent line on a portion of the first film or the second film where the first branch cable part or the second branch cable part is bent.

5. The flat flexible printed circuit according to claim 1, wherein the cable part includes a folding portion in which some conductors among the plurality of conductors are cut to generate a cut point and folded.

6. The flat flexible printed circuit according to claim 5, wherein the folding portion includes a support hole portion to prevent tearing at the cut point.

7. The flat flexible printed circuit according to claim 1, wherein the terminal connection part includes a coupling tool fastening portion which electrically connects some exposed conductors externally using a coupling tool by perforating some conductors exposed to some areas of the first film and the second film corresponding to the some exposed conductors.

8. The flat flexible printed circuit according to claim 7, wherein the coupling tool is a rivet or bolt made of a material conducting electricity.

9. The flat flexible printed circuit according to claim 1, wherein the terminal connection part includes a bonding portion which electrically connects some exposed conductors externally by applying bonding agents to some conductors exposed to some area of the first film.

10. The flat flexible printed circuit according to claim 1, wherein the terminal connection part comprises a fusion coupling portion which electrically fuses and bonds some conductors exposed to some areas of the first film and the second film externally.

11. The flat flexible printed circuit according to claim 10, wherein the fusion coupling portion electrically connects the some conductors exposed externally through laser or ultrasound.

12. The flat flexible printed circuit according to claim 1, wherein the first connector part includes:
   a first partial connector part which electrically connects some conductors of the plurality of conductors included in the cable part externally; and
   a second partial connector part which is cut in a lengthwise direction of the cable part and separated differently from the first partial connector part to connect other some conductors externally.

13. The flat flexible printed circuit according to claim 12, wherein the first partial connector part and the second partial connector part are separated from each other and have different lengths up to ends thereof.

14. The flat flexible printed circuit according to claim 1, further comprising:

a second connector part which is positioned at another end of the cable part to electrically connect some conductors included in the cable part externally.

15. The flat flexible printed circuit according to claim 14, wherein the second connector part includes:

a first partial end connector part which connects some conductors of multiple conductors included in the cable part externally; and a second partial end connector part which is cut in a lengthwise direction of the cable part and separated differently from the first partial end connector part to connect other conductors externally.

16. The flat flexible printed circuit according to claim 15, wherein the first partial end connector part and the second partial end connector part are separated from each other and have different lengths up to ends thereof.

\* \* \* \* \*